United States Patent [19]
Ishida

[11] Patent Number: 5,382,757
[45] Date of Patent: Jan. 17, 1995

[54] MULTILAYER PRINTED WIRING BOARD AND PROCESS FOR MANUFACTURING THE SAME

[75] Inventor: Hisashi Ishida, Tokyo, Japan

[73] Assignee: NEC Corporation, Tokyo, Japan

[21] Appl. No.: 778,242

[22] Filed: Oct. 17, 1991

[30] Foreign Application Priority Data

Oct. 17, 1990 [JP] Japan .................. 2-278110

[51] Int. Cl.[6] .................. H05K 1/00
[52] U.S. Cl. .................. 174/262; 174/250; 174/265; 361/767; 361/784; 361/785; 361/792; 361/794; 361/795
[58] Field of Search .......... 174/262, 250, 263, 264, 174/265, 266; 361/750, 753, 758, 767, 784, 785, 790, 792, 794, 795

[56] References Cited

U.S. PATENT DOCUMENTS 4,541,035 9/1985 Carlson et al.
4,736,521 4/1988 Dohya
4,963,697 10/1990 Peterson et al.

OTHER PUBLICATIONS

R. J. Jensen et al, "Copper/Polyimide Materials System for High Performance Packaging", IEEE, 1984, pp. 73–81.

*Primary Examiner*—Leo P. Picard
*Assistant Examiner*—Cheryl R. Figlin
*Attorney, Agent, or Firm*—Sughrue, Mion, Zinn, Macpeak & Seas

[57] ABSTRACT

The multilayer printed wiring board of this invention consists of a base substrate, a plurality of multilayer interconnections formed by lamination of metal wiring layer and insulation layer on the base substrate and ceramic substrates provided with through holes for electrical connection of the multilayer interconnections and inserted between two multilayer interconnections. The manufacturing method comprises lamination of metal wiring layers and insulation layers on both sides of ceramic substrates to form multilayer interconnections, forming of a multilayer interconnection on the base substrate by laminating a wiring layer and an insulation layer, and integration of the ceramic substrates with metal wiring layers and the base substrate placed together under heated and pressurized conditions.

3 Claims, 5 Drawing Sheets

MULTILAYER PRINTED WIRING BOARD AND PROCESS FOR MANUFACTURING THE SAME

BACKGROUND OF THE INVENTION

1. Field of the Invention

This invention relates to a multilayer printed wiring board and manufacturing process therefor, and particularly to a multilayer printed wiring board with a plurality of metal wiring layers and insulation layers laminated on the board and manufacturing process therefor.

2. Description of the Prior Art

In conventional multilayer printed wiring board, multiple thin film layers are structured by alternatively laminating insulation layers (made of polyimide resin, for example) and metal wiring layers on a ceramic base substrate as the foundation. Further, in the manufacturing process for such a multilayer printed wiring board, lamination of insulation and metal wiring layers is started from the lowest layer and a series of steps is repeated until the required number of layers are completed.

Such conventional manufacturing methods where a multilayer printed wiring board is fabricated by repetition of conductor and insulation layers laminating on the board include the method disclosed in "Copper/polyimide Materials System for High Performance Packaging" by R. J. Jenson and J. P. Cummings and H. Vora (1984, IEEE) and the one disclosed in U.S. Pat. No. 4,434,544.

In case of such conventional multilayer printed wiring board, since ceramic base substrate and polyimide used for insulation layer have different thermal expansion coefficients, thermal stress is generated at the base substrate during forming of multiple thin film layers for wiring, which results in residual stress between insulation layer and base substrate. This residual stress may lead to troubles such as cracks on polyimide resin, separation from ceramic multilayer printed wiring board and fracture at ceramic multilayer printed wiring board. In addition, with recent progress toward higher density mounting, film thickness of the multiple thin film layers for wiring consisting of polyimide resin insulation layer and metal wiring layer tends to be thicker. The thicker the film thickness becomes, the larger the above residual stress grows and the above troubles such as cracks on polyimide resin and separation and fracture at ceramic multilayer printed wiring board are becoming more serious.

Besides, in the conventional process to manufacture multilayer printed wiring board, manufacturing starts at the lowest layer first and a series of steps is repeated for lamination of insulation and metal wiring layers until the required number of layers are completed. This method takes quite a long time when a large number of thin film layers for wiring have to be formed on the ceramic base substrate. In addition, there is a possibility of worse yield, because unexpected defects may occur during too long manufacturing time.

SUMMARY OF THE INVENTION

An object of this invention is to provide a multilayer printed wiring board and a manufacturing method therefor which can reduce problems such as cracks of polyimide resin and separation and fracture at ceramic multilayer printed wiring board, and realize a shorter manufacturing time.

In a preferred embodiment of this invention to accomplish this object, the manufacturing method for multilayer printed wiring board of this invention comprises of a process where a metal wiring layer and an insulation layer are laminated on both sides of a ceramic substrate having through holes at predetermined positions for forming a multilayer interconnection electrically connected by the through holes above, a process to form a multilayer interconnection by laminating a metal wiring layer and an insulation layer on the base substrate, and a process where the above substrate is placed on the base substrate and they are integrated in pressurized and heated conditions.

Further, in a preferred embodiment, the process to form a multilayer interconnection on a ceramic substrate contains alternative lamination of wiring and insulation layers on both sides of the ceramic board to form a multilayer interconnection.

Additionally, the manufacturing method for a multilayer wiring board of this invention comprises of a process where a metal wiring layer and an insulation layer are laminated on both sides of a ceramic substrate having through holes at predetermined positions for forming a multilayer interconnection electrically connected by the through holes above, a process to form a multilayer interconnection by laminating a metal wiring layer and an insulation layer on the base substrate, a process where the above substrate is placed on the base substrate and they are integrated in pressurized and heated conditions and a process where other ceramic substrates with multilayer interconnections are placed one by one on the integrated ceramic substrates above and integrated again under pressurized and heated conditions.

In more preferred embodiment, the manufacturing method for a multilayer wiring board of the invention comprises of:

a process where multiple interconnections on both sides of a ceramic substrate having through holes at predetermined positions, which in turn comprises
- a step to form a connection wiring layer for mutual connection of both sides of the ceramic substrate via through holes,
- a step to form an insulation layer on the connection wiring layer,
- a step to form a signal wiring layer on the insulation layer for connection with the above-mentioned signal wiring layer,
- a step to form a connection bump at the signal wiring layer and
- a step to apply polyimide precursor to the connection bump; and a process where a wiring layer and an insulation layer are laminated on the base substrate, which comprises
- a step to form a connection wiring layer on above-mentioned base substrate,
- a step to form an insulation layer on the connection wiring layer,
- a step to form a signal wiring layer on the insulation layer for connection with the connection wiring layer,
- a step to form a connection bump at the signal wiring layer,
- a step to apply polyimide precursor to the connection bump and a step to integrate the ceramic substrate having wiring layers and the base substrate placed together under pressurized and heated conditions.

A multilayer printed wiring board of this invention to accomplish the object above is provided with a base substrate, a plurality of multilayer interconnections formed by lamination of wiring and insulation layers on said base substrate, and a ceramic substrate provided with through holes for electrical connection of multilayer interconnections and inserted between a pair of multilayer interconnections.

Other and further objects and effects of the invention will appear more fully from the following description.

DESCRIPTION OF THE PREFERRED EMBODIMENT

Figure 1:
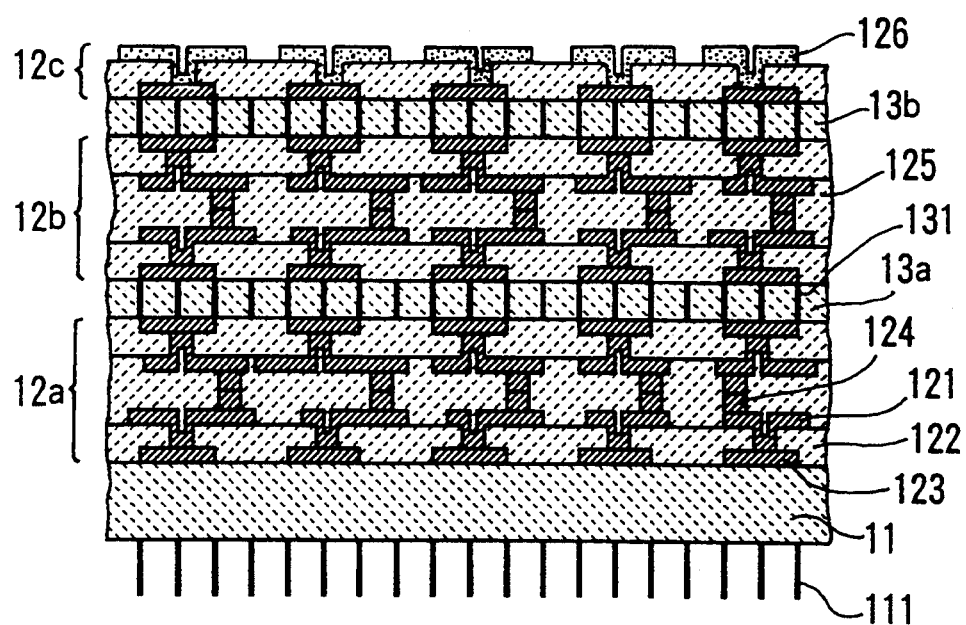
FIG. 1 is a cross sectional view to illustrate a multilayer printed wiring board according to an embodiment of this invention.

A preferred embodiment of this invention is now described referring to FIG. 1.

In FIG. 1, a multilayer printed wiring board of this embodiment consists of a ceramic base substrate 11 as the foundation, multilayer interconnections 12A to 12C thereon and ceramic substrates 13a and 13b laminated between above multilayer interconnections 12a and 12b and 12b and 12c.

The ceramic base substrate 11 is a simultaneously baked alumina ceramic substrate having an internal wiring layer made of metal such as molybdenum, provided with an I/O pin 111 for signals and power on the rear side. This embodiment uses a ceramic base substrate 11 having the size of 100 mm×100 mm and the thickness of 3 mm.

Multilayer interconnections 12a and 12b are structured by lamination of signal wiring layers 121, polyimide insulation layers 122, ground and connection layers 123, connection bumps 124 and additionally polymerized polyimide 125. The signal wiring layer 121 consists of gold plated wiring having the width of 25 $\mu$m and thickness of 7 $\mu$m. X-direction and Y-direction wiring forms a pair of signal wiring layers. Lamination of ground and connection layers 123 on the upper and lower sides of the signal wiring layer serves for impedance adjustment and crosstalk noise reduction.

The polyimide insulation layer 122 is made of a polyimide resin. Polyimide resins which can be used here include a product from Hitachi Chemical Co., Ltd. known as "PIQ", Du Pont's product known as "PYRALYN", Toray Industries, Inc.'s product known as "Semicofine" for non-photosensitive resins; and Hitachi Chemical's product known as "PL-1200", Du Pont.'s product known as "PI-2702D", Toray's product known as "Photonese", and Asahi Chemical Industry's product known as "PIMEL" for photosensitive polyimide resins. This polyimide insulation layer 122 causes the film thickness between the signal wiring layer 121 and ground and connection layer 123 to be 20 $\mu$m. The insulation layer uses a polyimide resin in this embodiment, but it may be made of any other organic resin.

Signal wiring layers 121 are electrically connected by the connection bump 124 in the additionally polymerized polyimide 125. This connection bump 124 has an area of 25 to 300 $\mu$m square and is 5 to 50 $\mu$m thick.

The multilayer interconnection 12c at the top is provided with connection pads 126 for connecting the polyimide insulation layer 122, ground and connection layer 123 and an LSI chip or other devices. For example, when Sn—Pb eutectic solder is used for soldering with the bump of a chip carrier containing an LSI chip, the connection pad 126 is plated with copper so as to prevent the pad from being affected by Sn—Pb solder.

The ceramic substrates 13a and 13b, placed between multilayer interconnections 12A and 12B and 12B and 12C, are provided with a large number of through holes 131 at predetermined positions. Ground and connection layers 123 of the multilayer interconnections 12a to 12c are electrically connected via these through holes 131. In this embodiment, ceramic substrates 13A and 13B are 0.5 mm thick.

Since the thermal expansion coefficient of the polyimide resin used for polyimide insulation layer 122 of multilayer interconnections 12a to 12c is larger than that of the ceramic used for substrate, thermal stress exerted on substrates during laminating process causes residual stress to be generated between the insulation layer and the substrate. This is particularly obvious in the vicinity of the polyimide insulation layer 122. Such residual stress results in that the ceramic base substrate 11 is pulled by polyimide insulation layer 122. The thicker the film of the polyimide insulation layer 122, the larger the residual stress grows.

As described above, multilayer interconnections 12a and 12b are sandwiched by the ceramic base substrate 11 and ceramic substrates 13a and 13b in this embodiment. The residual stress generated in the vicinity of the polyimide insulation layer 122 does not affect the ceramic base substrate 11 only, but is also absorbed by the upper and lower ceramic substrates 13a and 13b. Similarly, residual stress is generated between the multilayer interconnection 12b and ceramic substrate 13a or 13b. A large amount of residual stress generated in the vicinity of the multilayer interconnection 12b is absorbed by the ceramic substrates 13a and 13b.

Conventionally, multilayer interconnections are formed by lamination of polyimide insulation layers and wiring layers through repetition of a series of processes. When the thickness of such an interconnection exceeds 300 $\mu$m, the bond strength between the ceramic base substrate and insulation layer becomes incapable of resisting the residual stress generated in the vicinity, which results in separation of the insulation layer from the ceramic base substrate, cracks, or fractures at the ceramic base substrate.

In contrast, this embodiment has a structure where ceramic substrates 13a and 13b are inserted to absorb the residual stress as described above. This reduces the residual stress applied to the ceramic base substrate 11 and prevents the problems such as separation of the insulation layer from the ceramic base substrate 11, cracks and fractures at the ceramic base substrate 11. Thus, even for increased number of layers required by recent design with high-density mounting, residual stress generated in the vicinity of the thin film is not likely to cause problems.

Now referring to FIGS. 2, 8, 4, 5 and 6, a manufacturing method for a multilayer printed wiring board according to an embodiment of this invention is described.

For a multilayer printed wiring board of this embodiment, a block 31 is formed by lamination of ground and connection layers 123, polyimide insulation layers 122, signal wiring layers 121 and connection bump 124 on both sides of a ceramic substrate 13a, another block 32 is formed by lamination of ground and connection layers 123, polyimide insulation layers 122, signal wiring layers 121, connection bumps 124 and connection pads 126 on both sides of a ceramic substrate 18b, and still another block 88 is formed with a ground and connection layer 123, a polyimide insulation layer 122, a signal wiring layer 121, and a connecting bump 124 on a ceramic base substrate 11. Formed blocks 31 to 33 are laid together and integrated to make a multilayer printed wiring board. Each block is electrically checked at the time of completion so that good blocks are selected for next process. In the following manufacturing processes, photosensitive polyimide is used as polyimide resin and gold is used as the metal for wiring layer.

Figure 2A:
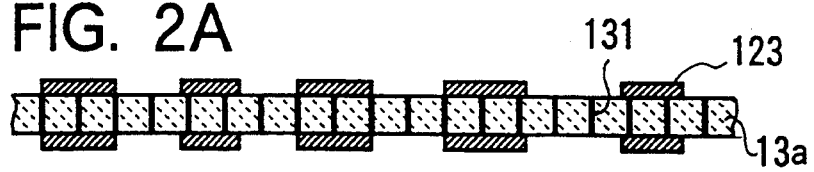
FIGS. 2A through 2E show a manufacturing process to form a multilayer interconnection on both sides of a ceramic substrate according to an embodiment.

FIGS. 2A to 2E show the manufacturing process of the block 31, which contains a ceramic substrate 13a. FIG. 2A is referred first. On the upper surface of the ceramic substrate 13a provided with through holes 131, one ground and connection layer 123 is formed by depositing a sputtered thin film, applying positive photoresist, providing a pattern using photolithography, and then electrolytically plating the pattern using gold as the plating metal. On the lower side of the ceramic substrate 13a, another ground and connection layer 123 is formed according to the same steps.

Figure 2B:
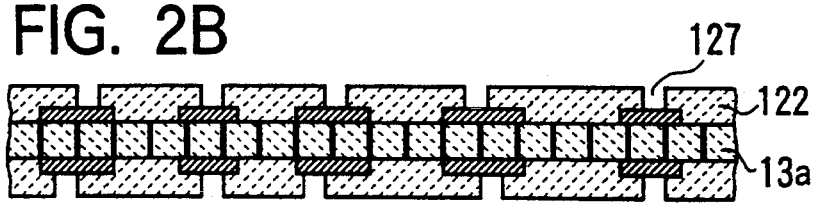

Referring to FIG. 2B next, polyimide insulation layers 122 are formed on the ceramic substrate 13a where the ground and connection layers 123 have been formed. Specifically, after application of photosensitive polyimide varnish, the substrate is subjected to exposure and development so that via holes 127 are formed at predetermined positions, and then cured (imidization of polyimide varnish). This step is also performed on both sides of the ceramic substrate 13a.

Figure 2C:
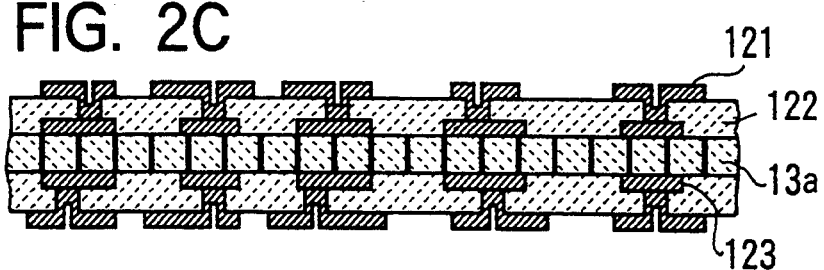

Referring to FIG. 2C, one signal wiring layer 121 is formed on each of the upper and lower polyimide insulation layers 122 by the same method as described for FIG. 2A. The signal wiring layer 121 is electrically connected with the ground and connection layer 123 through via holes 127 provided in the polyimide insulation layer 122. The signal wiring layer 121 is also formed on both sides of the ceramic substrate 13a.

Figure 2D:
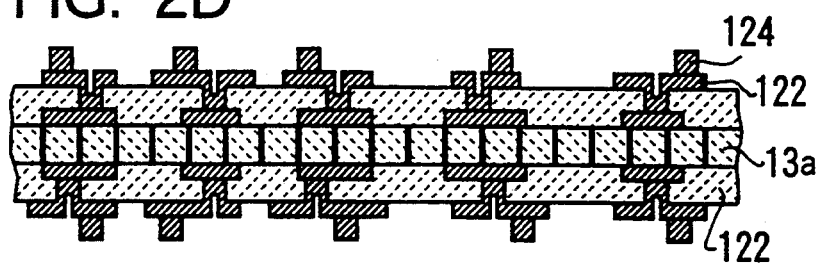

Now referring to FIG. 2D, a connection bump 124 is formed on the signal wiring layer 121 for electrical connection with signal wiring layers of other blocks 32 and 33. It is specifically formed by photolithography patterning using photoresist and electrolytic gold plating. The gold plating thickness is 7 μm. This connection bump 124 is also formed on both sides of the ceramic substrate 13a.

Figure 2E:
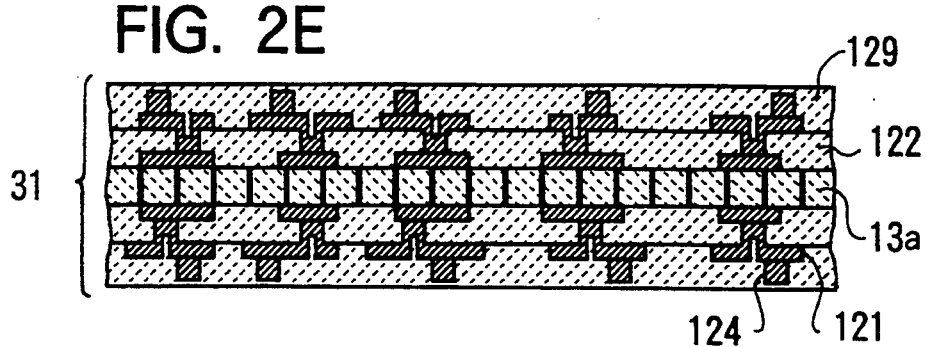

Referring to FIG. 2E, additionally polymerized polyimide precursor 129 is applied to the connection bumps 124 and subjected to pre-baking only. Now, the block with ceramic substrate 13a at the center of lamination is completed.

Figure 3A:
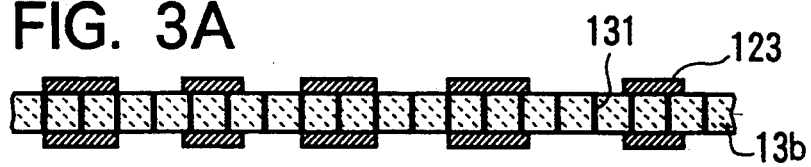
FIGS. 3A through 3E illustrate a manufacturing process to form a multilayer interconnection on a ceramic base substrate according to an embodiment.
Figure 3B:
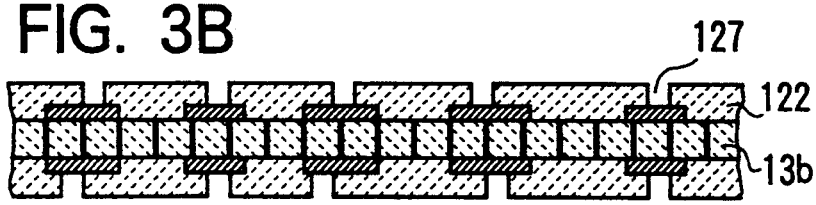
Figure 3C:
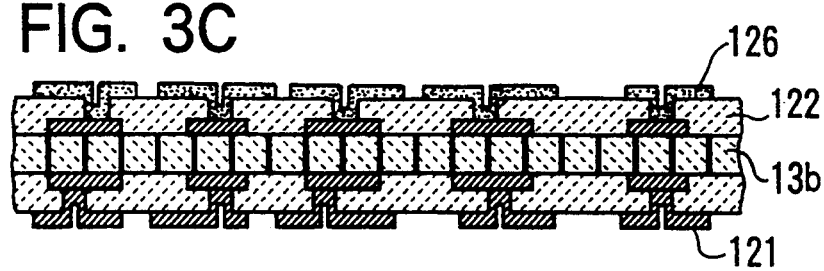
Figure 3D:
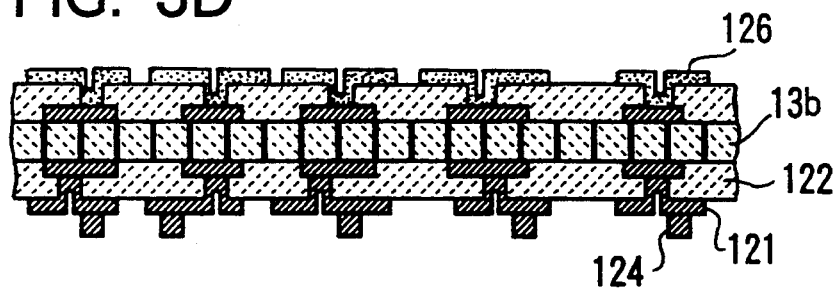
Figure 3E:
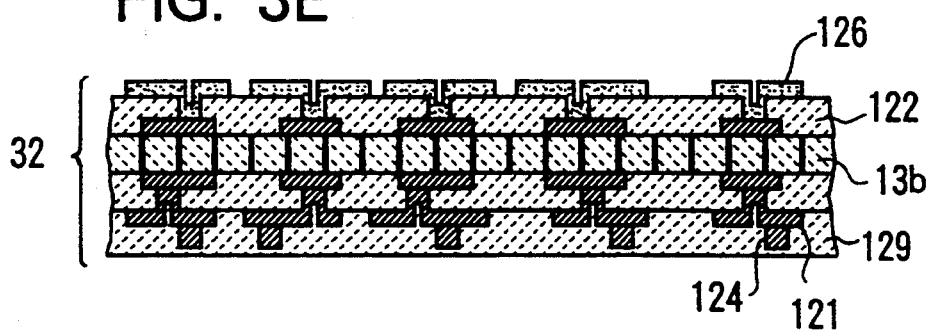

FIGS. 3A to 3E show the manufacturing process of the block 32, which contains a ceramic substrate 13b. Manufacturing steps for the block 32 shown in FIGS. 3A and 3B are the same as those in FIGS. 2A and 2B and explanation is omitted. Referring to FIG. 3C, the rear side of the ceramic substrate 13b is provided with a signal wiring layer 1221 as in FIG. 2C. For the uppermost surface of the ceramic substrate 13b, however, a connection pad 126 is formed on the polyimide insulation layer 122 for connection with an LSI chip or other devices. This connection pad 126 is made by copper plating. Referring now to FIGS. 3D and 3E, a connection bump 124 and a polyimide precursor 129 are formed on the rear side only of the ceramic substrate 13b by the same method as shown in FIGS. 2D and 2E. This completes the block 32.

The above steps described in FIGS. 2A to 2E and 3A to 3C are preformed alternatively on the upper and the lower side of the ceramic substrates 13a or 13b. Such an alternative lamination of layers serves for counterbalancing residual stress caused by polyimide insulation layers 122 and exerted on the ceramic substrate 13a or 13b. This almost eliminates the warpage of the ceramic substrates 13a and 13b and results in easy alignment of the ceramic substrates 13a and 13b when integrating them in the final process.

Figure 4A:
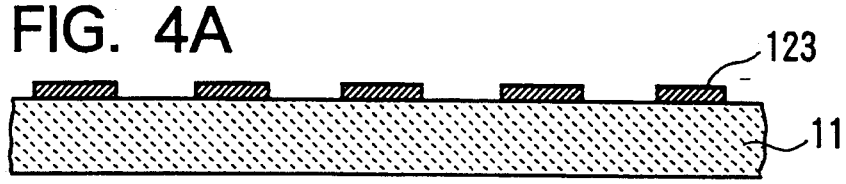
FIGS. 4A through 4E illustrate a manufacturing process to form a multilayer interconnection on a ceramic base substrate according to an embodiment.

Now, the manufacturing process of the block with the ceramic base substrate 11 is described referring to FIGS. 4A to 4E. Referring first to FIG. 4A, a pattern is drawn on the ceramic base substrate 11 by photolithography using photoresist and then the substrate is subjected to electrolytic gold plating so that a ground and connection layer 123 is formed.

Figure 4B:
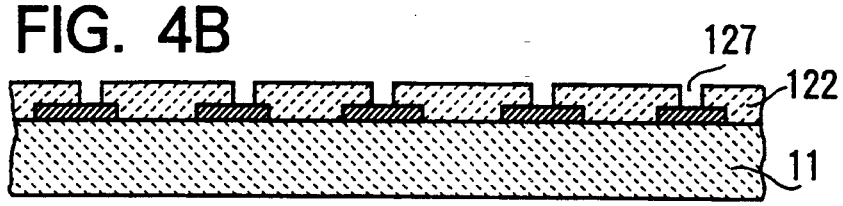

Referring to FIG. 4B, photosensitive polyimide varnish is applied to the substrate, which is exposed and developed so that via holes 127 are formed at predetermined positions and then cured (imidization of polyimide varnish). Thus, a polyimide insulation layer 122 is formed.

Figure 4C:
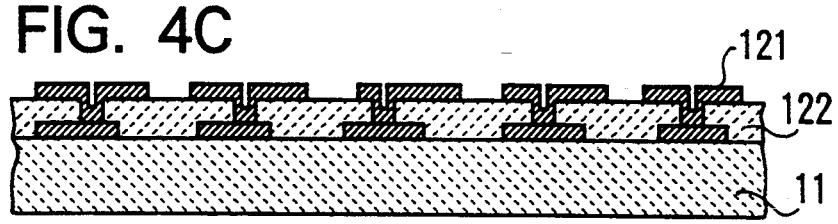

FIG. 4C, shows a signal wiring layer 121 formed on the polyimide insulation layer 122 by the same method as that used for ground and connection layer 123. The signal wiring layer 121 is electrically connected with the ground and connection layer 123 through via holes 127 provided in the polyimide insulation layer 122.

Figure 4D:
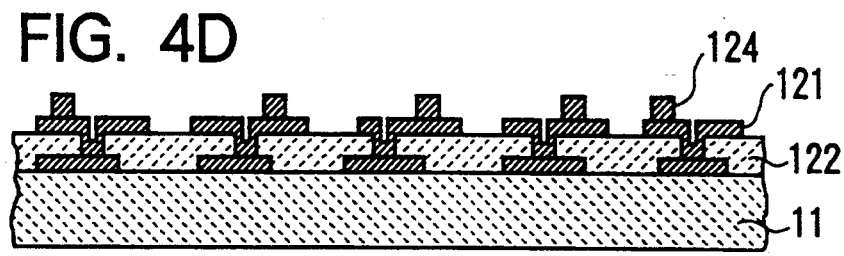

Referring to FIG. 4D, a connection bump 124 is formed on the signal wiring layer 121 for electrical connection with signal wiring layers of other blocks. This connection bump 124 is formed by photolithography patterning using photoresist and electrolytic gold plating.

Figure 4E:
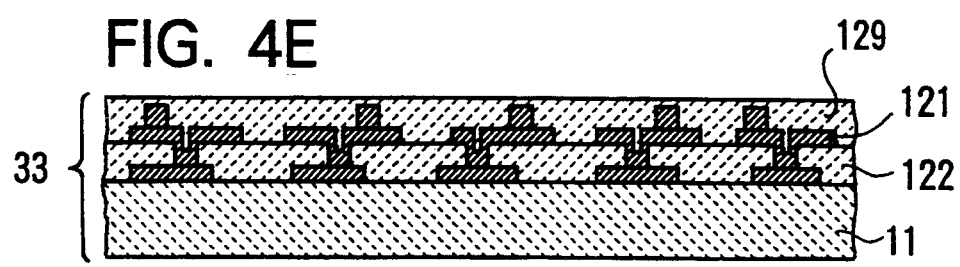

Referring to FIG. 4E, additionally polymerized polyimide precursor 129 is applied onto the layer of connection bump 27 and subjected to pre-baking only.

Thus, the block 33 containing a ceramic base substrate 11 is completed.

Figure 5:
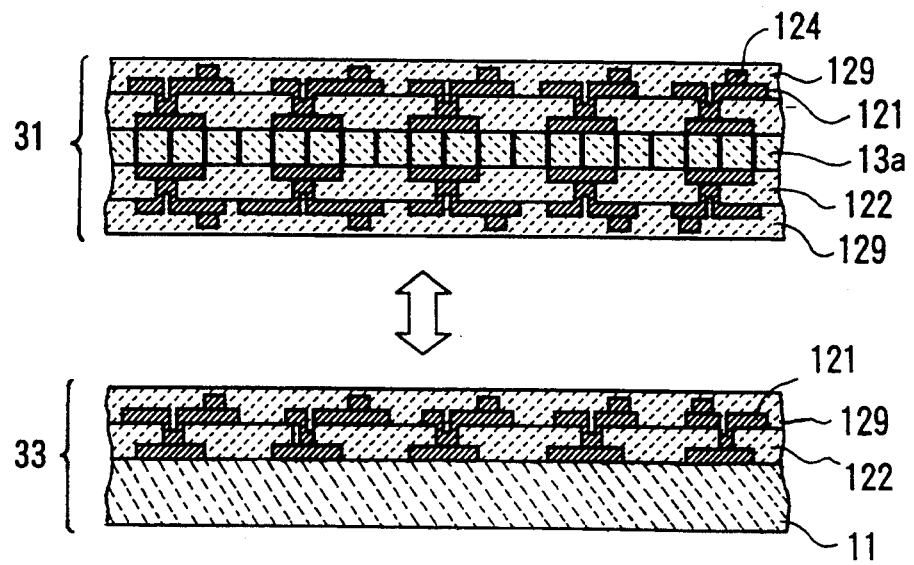
FIG. 5 shows a manufacturing process where the ceramic substrate block shown in FIG. 2 and the ceramic base substrate block in FIG. 4 are laminated.

After these processes, as shown in FIG. 5, the block 31 having the ceramic substrate 13a for which manufacturing process is shown in FIG. 2 is placed on the block 33 having the ceramic base substrate 11 shown in FIG. 4 with aligning them. They are then pressurized and heated in vacuum condition. Specifically, the blocks are subjected to pre-baking for 30 minutes at 65 C. under the pressure of 30 to 40 kg/cm$^2$. Then, under the same pressure, the blocks are pre-cured at 150° to 160° C., and finally subjected to 30-minute curing at 250° C. Bonding is performed under a reduced pressure of 10 Torr with an autoclave device.

The polyimide precursor on the connection bump is pushed aside due to vertical application of pressure, and at the same time, polyimide precursor 129 is imidized to be polyimide resin and integrated with the polyimide insulation layer 122. Volumetric shrinkage in this step causes two connection Dumps 124 to be closely attached and electrically connected. This bonding of block 31 and block 33 forms a multilayer interconnection 12A.

Figure 6:
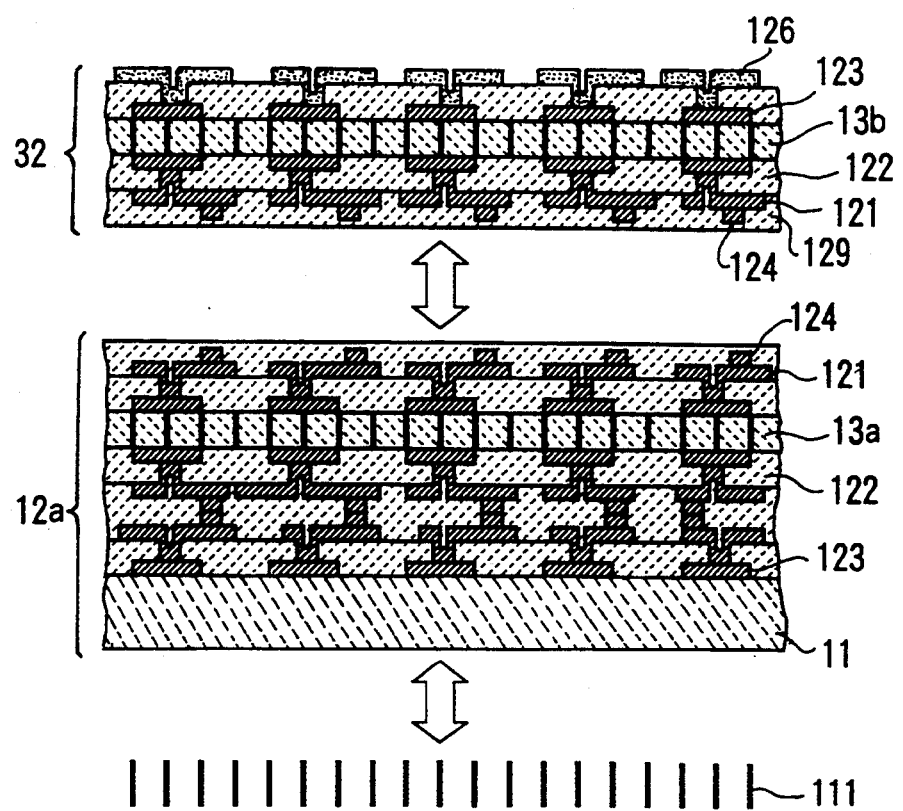
FIG. 6 shows the final process for a multilayer printed wiring board according to an embodiment.

Finally, as shown in FIG. 6, the block 32 having the ceramic substrate 13b is aligned and placed on the block 31 laminated in FIG. 5 and they are pressurized and heated in vacuum as in the process shown by FIG. 5. The last step is to provide I/O pin 111 for signal and power at the predetermined position on the rear side of the ceramic base substrate 11.

Conventional method where the wiring layer and insulation layer are alternatively formed on the ceramic base substrate starting from the lowest layer takes a long time for fabrication of a multilayer printed wiring board with many layers required with higher density mounting, which may be involved with unexpected defects, resulting in worse yield.

In this embodiment, the manufacturing processes as described above can largely reduce the manufacturing time for multilayer printed wiring board with improving the yield at the same time.

Obviously, many modifications and variations of the above embodiment are possible in the scope of this invention. For example, though the disclosed embodiment above uses two ceramic substrates, any number of substrates can be used according to the required number of layers and difference in thermal expansion coefficient of the materials to be used. Further, the metal used for signal wiring layer, ground and connection layer and connection bump is not limited to gold and copper or other metals may be used. Any variations without departing from the spirit and scope of the invention are covered by the claims.

What is claimed is:
1. A multilayer printed wiring board comprising:
(A) a first block, comprising, in order,
 (a) a base substrate,
 (b) a first polyamide insulating layer,
 (c) a first signal wiring layer, and
 (d) a first bump electrically connected to said signal wiring layer; and
(B) a plurality of second blocks, each comprising,
 (e) a ceramic substrate,
 (f) second polyamide insulating layers, respectively provided on opposite sides of said ceramic substrate,
 (g) second signal wiring layers, respectively provided on a side of said second polyamide insulating layers,
 (h) second bumps electrically connected to said second signal wiring layers,
 (i) a through hole provided in said ceramic substrate, connecting said second signal wiring layers;
wherein said second blocks are laminated,
wherein said second bump of said second block is connected to the adjacent second bump of another second block; and
wherein the second bump of one second block is connected to the first bump of the first block.

2. A multilayer printed wiring board as claimed in claim 1, wherein said second bumps are connected to each other by thermal compression bonding, and wherein the second bump of one second block is connected to the first bump of the first block by thermal compression bonding.

3. A multilayer printed wiring board as claimed in claim 1, comprising, a plurality of third polyamide layers, wherein a third polyamide layer is provided between said first block and said second black, and wherein another third polyamide layer is provided between said second blocks.

* * * * *

UNITED STATES PATENT AND TRADEMARK OFFICE
CERTIFICATE OF CORRECTION

PATENT NO. : 5,382,757
DATED : January 17, 1995
INVENTOR(S) : Hisashi Ishida

It is certified that error appears in the above-indentified patent and that said Letters Patent is hereby corrected as shown below:

Column 6, line 7, change "1221" to --121--.

Column 8, line 37, change "black" to --block--.

Signed and Sealed this

Third Day of October, 1995

Attest:

BRUCE LEHMAN

*Attesting Officer*  *Commissioner of Patents and Trademarks*